(12) United States Patent
Tarn

(10) Patent No.: US 9,056,764 B2
(45) Date of Patent: Jun. 16, 2015

(54) MICROELECTROMECHANICAL DEVICE PACKAGES WITH INTEGRAL HEATERS

(75) Inventor: Terry Tarn, San Diego, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1638 days.

(21) Appl. No.: 11/872,825

(22) Filed: Oct. 16, 2007

(65) Prior Publication Data

US 2012/0180949 A1   Jul. 19, 2012

Related U.S. Application Data

(62) Division of application No. 11/043,507, filed on Jan. 25, 2005, now Pat. No. 7,282,393, which is a division of application No. 10/443,318, filed on May 22, 2003, now abandoned.

(51) Int. Cl.
*H01L 21/00* (2006.01)
*B81C 1/00* (2006.01)
*G02B 26/08* (2006.01)
*H01L 23/10* (2006.01)

(52) U.S. Cl.
CPC ........... *B81C 1/00269* (2013.01); *Y10T 156/10* (2015.01); *B81C 2203/0181* (2013.01); *G02B 26/0841* (2013.01); *H01L 23/10* (2013.01); *H01L 2924/01079* (2013.01); *H01L 2924/09701* (2013.01); *H01L 2924/12044* (2013.01); *H01L 2924/16195* (2013.01); *H01L 2924/0002* (2013.01)

(58) Field of Classification Search
USPC .......... 257/E23.193; 438/116, 118, 119, 456, 438/470
See application file for complete search history.

(56) References Cited

U.S. PATENT DOCUMENTS

| | | |
|---|---|---|
| 5,010,233 A | 4/1991 | Henschen et al. |
| 5,175,409 A | 12/1992 | Kent |
| 5,621,162 A | 4/1997 | Yun et al. |
| 5,702,764 A | 12/1997 | Kimura et al. |
| 5,835,256 A | 11/1998 | Huibers |
| 5,938,956 A | 8/1999 | Hembree et al. |
| 5,952,572 A | 9/1999 | Yamashita et al. |

(Continued)

FOREIGN PATENT DOCUMENTS

JP   05-326740   10/1993

OTHER PUBLICATIONS

Y.T. Cheng, et al., "Localized Silicon Fusion and Eutectic Bonding for MEMS Fabrication and Packaging", Journal of Microelectromechanical Systems, vol. 9, No. 1, Mar. 2000, pp. 3-8.

(Continued)

*Primary Examiner* — Robert Huber
(74) *Attorney, Agent, or Firm* — Jacqueline J. Garner; Frank D. Cimino

(57) ABSTRACT

A microelectromechanical device package with integral a heater and a method for packaging the microelectromechanical device are disclosed in this invention. The microelectromechanical device package comprises a first package substrate and second substrate, between which a microelectromechanical device, such as a micromirror array device is located. In order to bonding the first and second package substrates so as to package the microelectromechanical device inside, a sealing medium layer is deposited, and heated by the heater so as to bond the first and second package substrates together.

22 Claims, 11 Drawing Sheets

(56) References Cited

U.S. PATENT DOCUMENTS

| | | | |
|---|---|---|---|
| 5,998,242 | A | 12/1999 | Kirkpatrick et al. |
| 6,164,837 | A | 12/2000 | Haake et al. |
| 6,232,150 | B1 | 5/2001 | Lin et al. |
| 6,265,246 | B1 | 7/2001 | Ruby et al. |
| 6,295,154 | B1 * | 9/2001 | Laor et al. .................. 359/223.1 |
| 6,297,072 | B1 | 10/2001 | Tilmans et al. |
| 6,458,627 | B1 | 10/2002 | Choi |
| 6,528,344 | B2 | 3/2003 | Kang |
| 6,614,003 | B2 | 9/2003 | Hembree et al. |
| 6,624,003 | B1 | 9/2003 | Rice |
| 6,674,159 | B1 | 1/2004 | Peterson et al. |
| 6,791,735 | B2 | 9/2004 | Stappaerts |
| 6,810,899 | B2 | 11/2004 | Franz et al. |
| 6,914,711 | B2 | 7/2005 | Novotny et al. |
| 7,042,623 | B1 | 5/2006 | Huibers et al. |
| 7,282,393 | B2 | 10/2007 | Tarn |
| 2003/0089394 | A1 | 5/2003 | Chang-Chien et al. |
| 2003/0104651 | A1 | 6/2003 | Kim et al. |
| 2004/0035840 | A1 | 2/2004 | Koopmans |
| 2004/0067604 | A1 | 4/2004 | Ouellet et al. |
| 2004/0232535 | A1 | 11/2004 | Tarn |

OTHER PUBLICATIONS

Duck-Jung Lee, et al., "Development of In-Line Sealing Method for Plasma Display Panel", SID 02 Digest, pp. 412-415, 2002.

Sang Jik Kwon, et al., "Vacuum In-Line Sealing Technology with Auxiliary Heating Line for PDP Packaging", SID 02 Digest, pp. 320-323, 2002.

Liwei Lin, "MEMS Post-Packaging by Localized Heating and Bonding", 2000 IEEE, pp. 608-616.

Farhad Sarvar, et al., "Application of Adhesives in MEMS and MOEMS Assembly: A Review", IEEE Polytronic 2002 Conference, pp. 22-28.

Seong-A Kim, et al., "Closed Loop Solder-Lines on Heated Substrates", 2002 Electronic Components and Technology Conference, pp. 1101-1105.

Giles Humpston and David M. Jacobsen, "Principles of Soldering and Brazing", ASM International, 7.3.2.3 Solution, pp. 242-245, 2001.

Chang-Chien, et al., "Wafer-Level Packaging and Frequency Trimming by Localized Mass Deposition", Abstract.

* cited by examiner

MICROELECTROMECHANICAL DEVICE PACKAGES WITH INTEGRAL HEATERS

CROSS-REFERENCE TO RELATED PATENT APPLICATIONS

This application is a divisional of application Ser. No. 11/043,507, filed Jan. 25, 2005 which is a divisional of application Ser. No. 10/443,318, filed May 22, 2003.

TECHNICAL FIELD OF THE INVENTION

The present invention is generally related to the art of microelectromechanical device packages, and more particularly, to spatial light modulators having micromirror device packages with integral heaters.

BACKGROUND OF THE INVENTION

Micromirrors are key components of microelectromechanical system (MEMS)-based spatial light modulators (SLM). A typical MEMS-based SLM usually consists of an array of miniature micromirrors. These micromirrors are selectively deflected, for example, in response to an electrostatic force, which in turn selectively reflect incident light to produce digital images. Such micromirrors, however, are extremely sensitive to contamination, such as moisture and dust. This contamination has varying effects on the micromirrors, from capillary-condensation and post-release stiction to deterioration of the micromirror surfaces. Such effects can cause mechanical failure of the micromirrors in operation. For this and other reasons, micromirror array devices are often packaged after releasing.

Regardless of differences of the packaging methods currently developed for a micromirror array device, two substrates, one for supporting the device and another one for covering the device, and sealing medium(s) for bonding the two substrates are utilized. Most of the sealing mediums require application of heat during bonding. However, the heat, if not properly applied, may degrade the micromirror array device. For example, improperly applied heat may change the desired mechanical properties of the micromirrors. It may also thermally activate particles, such as impurities and particles making up the micromirrors, prompting diffusion of these activated particles within the micromirrors, thus exacerbating degradation of the micromirrors. Or heat may decrease anti-stiction materials within the package.

Therefore, a method and an apparatus are needed for packaging micromirror array devices.

SUMMARY OF THE INVENTION

In view of the forgoing, the present invention provides an apparatus for packaging micromirror array devices and a method of packaging micromirror devices using the same. In order to package the micromirror device, a first and second substrate is provided. The micromirror array device is accommodated within a cavity formed by the first and second substrate. During packaging, one or more sealing mediums that are applied between the first and second substrate are soldered by at least a heater that is formed along the periphery of the surface of either the first or the second substrate and embedded underneath said surface of said substrate. The first and the second substrates are then bonded through the soldered sealing mediums.

According to an embodiment of the invention, a substrate of a package for packaging a micromirror array device is provided therein. The substrate comprises: a laminate that comprises a plurality of substrate layers bonded together; and a heater that is disposed along a periphery of one substrate layer of the plurality of substrate layers and disposed between said substrate layer and another substrate layer of the plurality of substrate layers.

According to another embodiment of the invention, a package is provided. The package comprises: a first substrate having a heater along a periphery of a surface of the first substrate and underneath said surface; a second substrate above the first substrate; a semiconductor device or a microelectromechanical system device between the first and second substrate; and a first sealing medium layer between the first substrate and the second substrate.

According to a further embodiment of the invention, a method of packaging a micromirror array device is disclosed. The method comprises: providing a first package substrate that comprises a heater integral with and along a periphery of one surface of the first substrate; attaching a semiconductor device or a microelectromechanical device to the first substrate; depositing a first sealing medium layer on the surface of the first substrate; placing a second substrate on the first sealing medium layer; driving an electric current through the heater so as to generate heat for melting the first sealing medium; and bonding the first and second substrate by the melted sealing medium layer.

According to another embodiment of the invention, a system is provided. The system comprises: a light source for providing an incident light; a spatial light modulator for selectively modulating the incident light so as to form an image on a display target, wherein the spatial light modulator further comprises: a first package substrate having a heater along a periphery of one surface of the first package substrate and embedded underneath said surface for generating heat; a micromirror array device held on the first package substrate; a second package substrate on the first package substrate; a first sealing medium layer deposited between the first and second package substrate; and wherein the first and second package substrate is bonded together through the first sealing medium layer; a condensing optical element for directing the incident light onto the spatial light modulator; a display target; and a projection optic element for directing the modulated light onto the display target.

BRIEF DESCRIPTION OF THE DRAWINGS

While the appended claims set forth the features of the present invention with particularity, the invention, together with its objects and advantages, may be best understood from the following detailed description taken in conjunction with the accompanying drawings of which:

FIG. 2b is a cross-sectional view of the packaging substrate of FIG. 2a;

FIG. 4b is a cross-sectional view of the package in FIG. 4a;

FIG. 5b is a cross-sectional view of the micromirror array package of FIG. 5a;

FIG. 6b is a cross-sectional view of the micromirror array device of FIG. 6a;

FIG. 9b is a diagram schematically illustrating an exemplary micromirror array consisting of the micromirror of FIG. 9a;

FIG. 10b is a diagram schematically illustrating an exemplary micromirror array consisting of the micromirror of FIG. 10a.

DETAILED DESCRIPTION OF THE INVENTION

Turning to the drawings, the present invention is illustrated as being implemented in a suitable packaging process for micromirror array devices. The following description is based on selected embodiments of the invention and should not be interpreted as a limitation of the invention with regard to alternative embodiments that are not explicitly described herein.

Figure 1A:
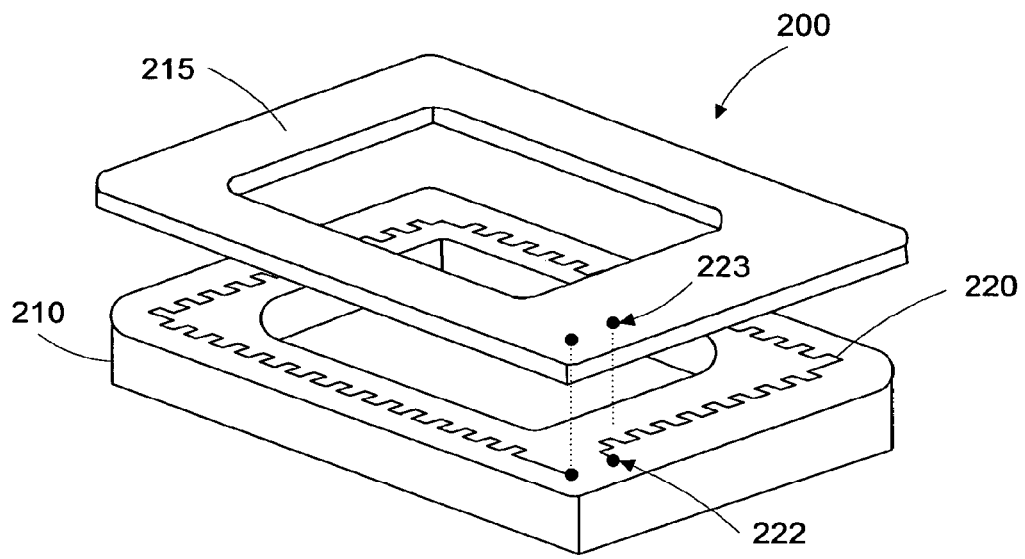
FIG. 1a is a diagram schematically illustrating a packaging substrate for packaging a micromirror array device, the packaging substrate having a heater that is formed along the periphery of one surface of the substrate and embedded underneath said surface of said substrate according to an embodiment of the invention.
Figure 1B:
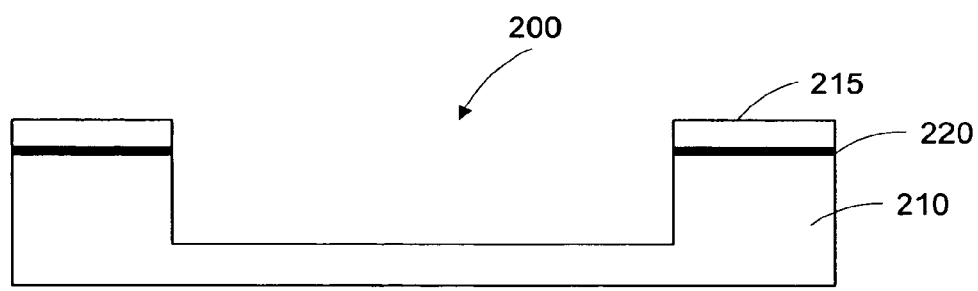
FIG. 1b is a cross-sectional view of the package substrate of FIG. 1.

Referring to FIG. 1a, a packaging substrate with an integral heater for packaging micromirror array devices is illustrated therein. As seen, packaging substrate 200 comprises substrate layer 210 and substrate layer 215. Substrate layer 210 has a concave surface that forms a cavity in which micromirror array device can be placed. On substrate layer 210, heater 220 is formed along the periphery of the concave surface of substrate layer 210. Electric current from external electric power source can be introduced into heater 220 via two leads 222 so as to generate heat. Heater 220 is laminated between substrate layers 210 and 215. A cross-sectional view of packaging substrate 200 is illustrated in FIG. 1b.

In a preferred embodiment of the invention, heater 220 has a zigzag edge as shown in FIG. 1a. Alternatively, the heater can take any other suitable forms, such as a set of consecutively connected straight lines (or disconnected lines each having leads at each end), coils or combinations of lines and coils or zigzag lines. Other than forming the heater on substrate layer 210 which comprises a cavity for accommodating micromirror array devices, the heater can also be formed on substrate 215. In particular, the heater can be formed on substrate 215 and on the surface that faces substrate 210. As will be seen in FIG. 2a, substrate 215 is not necessary, and if not provided, preferably heater 220 is patterned on or otherwise integral with substrate 210. The heater can be made of any suitable materials, such as tungsten, and can be formed by any suitable methods (e.g. sputtering and electro-plating) for making a thin film and standard methods (e.g. printing) for making a thick film. In order to generate heat, electric current is driven through the two leads 222. Alternatively, the electric current can also be introduced into the heater through leads 223, which are formed on substrate layer 215 and connected to the two leads 222 respectively.

Substrate layers 210 and 215 can be any suitable preferably non-electrically conducting materials, preferably ceramic or glass, and more preferably ceramic. Other materials (e.g. organic or hybrid organic-inorganic materials) could also be used depending upon their melting points. In another embodiment of the invention, substrate layers 210 and 215 each can be a multilayered structure that further comprises a plurality of substrate layers. In this situation, the top layer, on which the heater is disposed, of substrate 210 and the bottom layer, which faces the heater, of substrate 215 are preferably non-electrically conducting. Other layers, including the substrate layers underneath the top layer of substrate 210 and the substrate layers above the bottom layer of substrate 215 can be any desired materials, such as ceramic, glass and metallic materials.

Figure 2A:
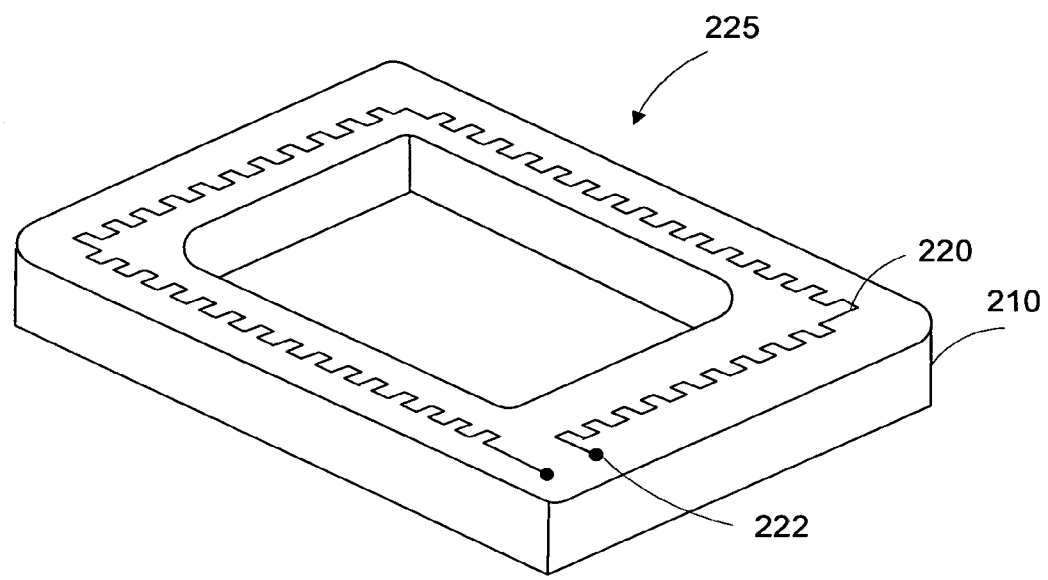
FIG. 2a is a diagram schematically illustrating a packaging substrate for packaging a micromirror array device, the packaging substrate having a heater formed along the periphery of one surface of the packaging substrate, and wherein the heater has a zigzag edge according to another embodiment of the invention.
Figure 2B:
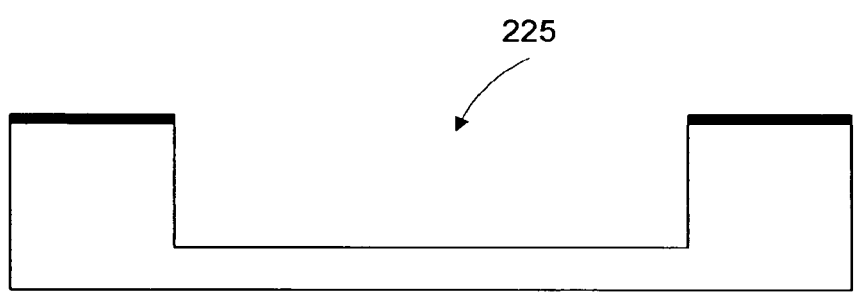

Other than embedding the heater underneath the surface of the packaging substrate, the heater can be formed on the surface of the packaging substrate as shown in FIGS. 2a and 2b. Referring to FIG. 2a, the heater is formed along the surface of substrate 210, and no other substrate layer is formed thereon. Substrate 210 could be a multilayered structure. The heater is directly exposed to other materials, such as sealing mediums, and structures, such as other packaging substrates. In this situation, the sealing medium deposited on the heater is preferably non-electrically conducting materials, such as glass frit.

Figure 3:
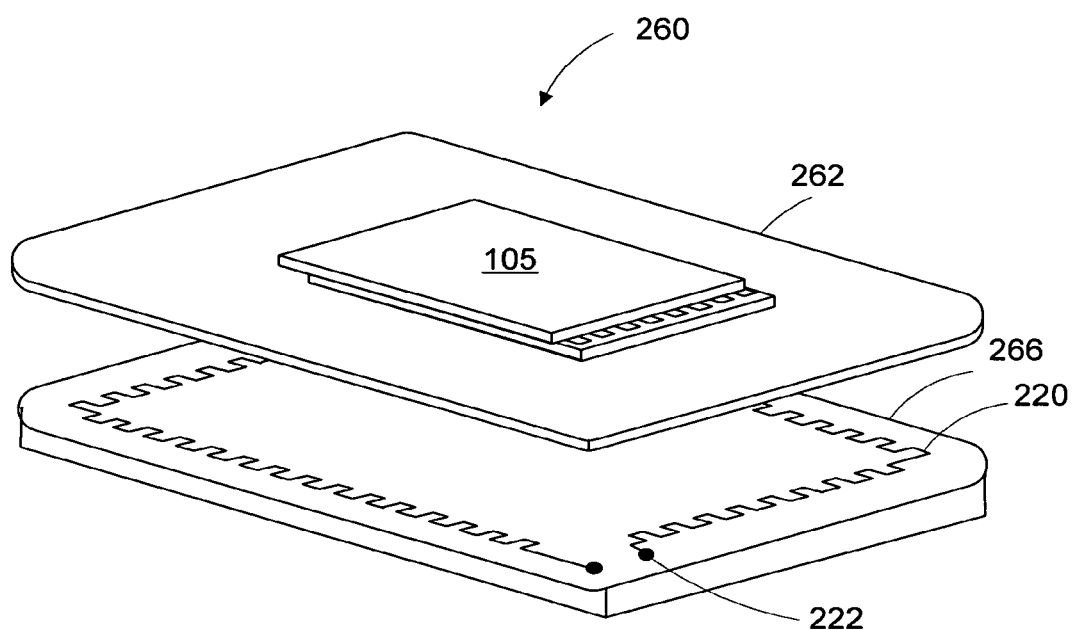
FIG. 3 is a diagram schematically illustrating a packaging substrate having a heater that is laminated between two layers of said packaging substrate according to another embodiment of the invention.

As discussed above, substrate layer 210 has a concave surface that forms a cavity in which micromirror array device can be placed. Alternatively, the substrate layers can be flat plates, as shown in FIG. 3. Referring to FIG. 3, substrate layers 266 and 262 of package substrate 260 both are flat plates. Heater 220, which is formed on substrate layer 266 and along the periphery of the surface of substrate layer 266, is laminated between substrate layers 266 and 262. Similar to the heater in FIG. 2a, an electric current can be driven through the heater via the two heater leads 222 for generating heat.

Other than forming heater 220 on substrate layer 266, the heater can also be formed on substrate 262. In particular, the heater can be formed on substrate 262 and on the surface that faces substrate layer 266. Similar to the substrate layers 210 and 215 in FIG. 2a, substrate layers 262 and 266 can be any suitable non-electrically conducting materials, preferably ceramic and glass, and more preferably ceramic. In another embodiment of the invention, substrate layers 266 and 262 each can be a multilayered structure that further comprises a plurality of substrate layers. In this situation, the top layer, on which the heater is disposed, of substrate 266 and the bottom layer, which faces the heater, of substrate 262 are preferably non-electrically conducting layers. Other layers, including the substrate layers underneath the top layer of substrate 266 and the substrate layers above the bottom layer of substrate 262 can be any desired materials, such as ceramic, glass and metallic materials. Micromirror array device 105 can be attached to substrate layer 262 and supported thereby.

In the following, exemplary implementations of the embodiments of the present invention will be discussed with reference to packages of micromirror array devices and packaging processes for making the same. It will be understood by those skilled in the art that the following exemplary implementations are for demonstration purposes only and should not be interpreted by any ways as a limitation. In particular, although not limited thereto, the present invention is particularly useful for packaging semiconductor devices or micromirror array devices. The packages with integral heaters and methods of using the packages with integral heaters can also be applied in packaging other microelectromechanical systems, such as MEMS-based optical switches, image sensors or detectors and semiconductor devices requiring low temperature hermetic sealing. Moreover, the following exemplary implementation will be discussed with reference to heaters with zigzag edges and packaging substrate with substantially rectangular shapes for clarity and demonstration purposes only. Other variations of the heaters and the packaging substrates without departure from the spirit of the present invention may also be applicable. For example, the heater may be composed of a set of segments with each segment being a straight line, a coil, a zigzag line or other desired forms. For another example, the packaging substrate layers can be any desired shapes, other than the preferred rectangular shape.

Figure 4A:
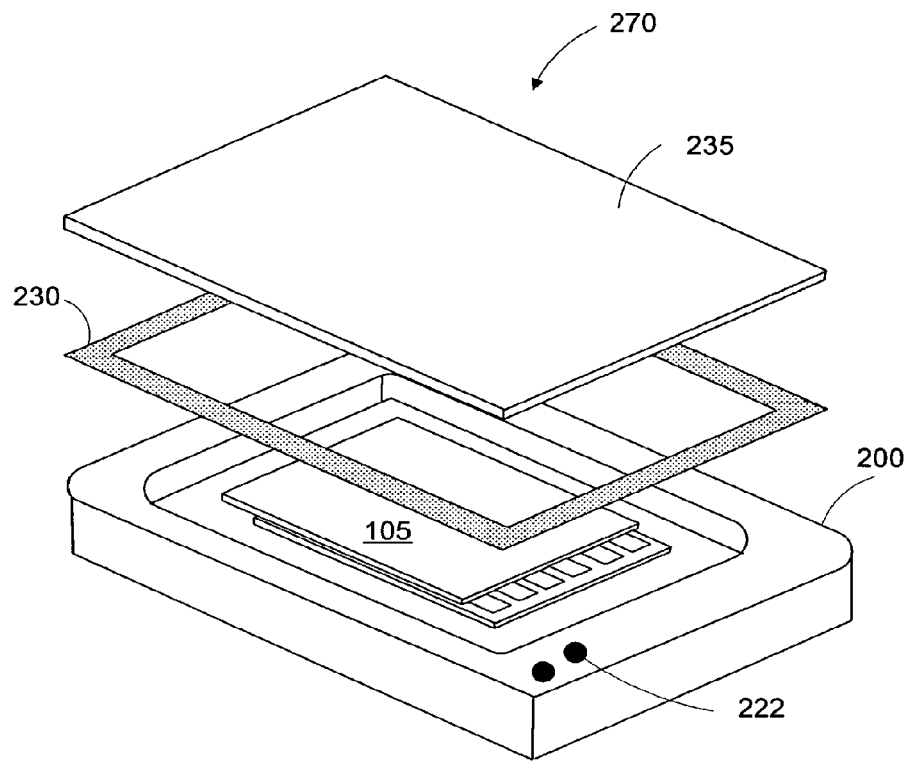
FIG. 4a is a diagram schematically illustrating a micromirror array device that is packaged using a packaging substrate in FIG. 1 according to another embodiment of the invention.

Referring to FIG. 4a, a micromirror array device package using the packaging substrate with an integral heater in FIG. 1 is illustrated therein. Specifically, micromirror array device 105 is placed in the cavity of packaging substrate 200, which comprises integral heater 220 as shown in FIG. 1. A double substrate type micromirror device is illustrated, however, as in all the drawings, a single substrate device (e.g. micromirrors formed on silicon wafer) could be used. Cover substrate 235, which is preferably glass, is provided for sealing the micromirror array device within the cavity. In order to bond cover substrate 270 and packaging substrate 200, sealing medium 230, preferably one that forms a hermetic seal and has a melting temperature of 300° C. or less, and preferably 200° C. or less, is disposed between the cover substrate and packaging substrate as shown. Preferably the sealing material is an inorganic material such as a metal, metal alloy or metal compounds (e.g. a metal or metalloid oxide). Alternatively, sealing medium layer 230 can also be deposited directly on the surface of packaging substrate 200, or on the surface of the lower surface of cover substrate 235, in which case, sealing medium layer 230 is preferably deposited along the periphery of the lower surface of the cover substrate. Sealing medium 230 is preferably a material that is stable, reliable, cost-effective and has good thermal properties (e.g. coefficient of thermal expansion (CET), thermal conductivity, etc.) compatible with the other components, such as package substrate 200 and cover substrate 235, of the micromirror array device package. It is further preferred that sealing medium 230 has a low melting temperature (when the sealing medium is non-metallic) or soldering temperature (when the sealing medium is metallic). Glass frit, such as Kyocera KC-700, is an acceptable candidate for the sealing medium. During the bonding process, an electric current is driven through the integral heater via the two heater leads (i.e. leads 222) for generating heat. The amplitude of the electric voltage is dominated by electric characteristics of the heater (e.g. electric properties of the material of the heater, the shape of the heater), thermal characteristics and geometry of the substrate layers of packaging substrate 200 and the desired temperature on the surface of packaging substrate 200 for melting sealing medium (e.g. sealing medium layer 230). As an example, the melting temperature, also the desired temperature on the surface of packaging substrate 200, of sealing medium 230 is from 100 to 300° C. The heater is embedded underneath the surface of the packaging substrate at a distance preferably from 1 millimeter to 10 millimeters, preferably around 7 millimeters. In this example, the packaging substrate is ceramic. Then the voltage set up between the two heater leads 222 is preferably from 40 to 100 volts, preferably around 70 volts. In other words, this voltage causes the heater generating heat with an amount that raises the surface temperature of the packaging substrate to the melting temperature of sealing medium layer 230. As a result, sealing medium is melted and used to bond cover substrate 235 and packaging substrate 200. Meanwhile, the temperature at the micromirror device location is far less than the temperature that causes mechanical failure of the micromirrors of the micromirror device. In the embodiment of the invention, the temperature at the micromirror device location is preferably less than 70° C.

Figure 4B:
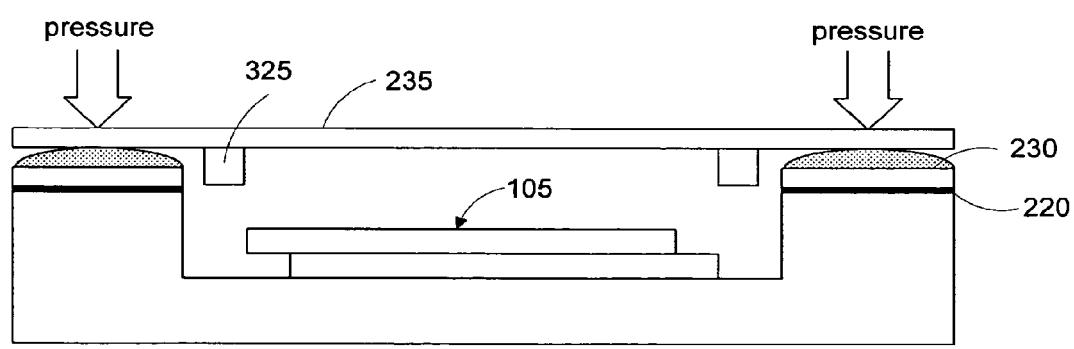

During the bonding process, external pressure may be applied to the cover substrate, as shown in FIG. 4b, wherein a cross-sectional view of FIG. 4a is illustrated therein. After a predetermined time period when the cover substrate and the packaging substrate are securely bonded, the voltage, as well as the external pressure, can be withdrawn, but not necessarily at the same time. As shown in FIG. 4b, one or more getters 325 can be provided within the package 270 for absorbing moistures and impurity particles (e.g. organic particles) either sealed within the cavity or emitted from the components of package 270 during the packaging process, especially during the heating process.

Though cover substrate 235 is preferably visible light transparent glass, it may also be other materials, such as metals or materials that are not transparent to visible light. In these cases, cover substrate 235 preferably comprises an inlay light transparent glass for allowing light to travel through and shine on micromirror array device 105. Alternatively, cover substrate 235 may have an opening forming a window with a light transparent glass mounted on the window for allowing transmission of incident light. Moreover, a light blocking mask with light blocking strips formed around the circumference of the mask may be applied along cover substrate 235 for blocking incident light not shining on the surface of the micromirror array device. By this, optical performance, such as contrast ratio, of the micromirror array device can be improved.

Other than using glass frit as sealing medium, other suitable materials, such as solderable metallic materials, such as Au, $BiSn_x$, $AuSn_x$, $InAg_x$, $PbSn_x$, and copper, may also be used. However, most solderable metallic materials have poor adhesion to oxide materials or layers that often form on surfaces of the substrates. To solve this problem, a metallization film is preferably employed to metalize the surface of the substrate before using solderable metallic sealing mediums, which will be discussed in further detail in the following.

Figure 5A:
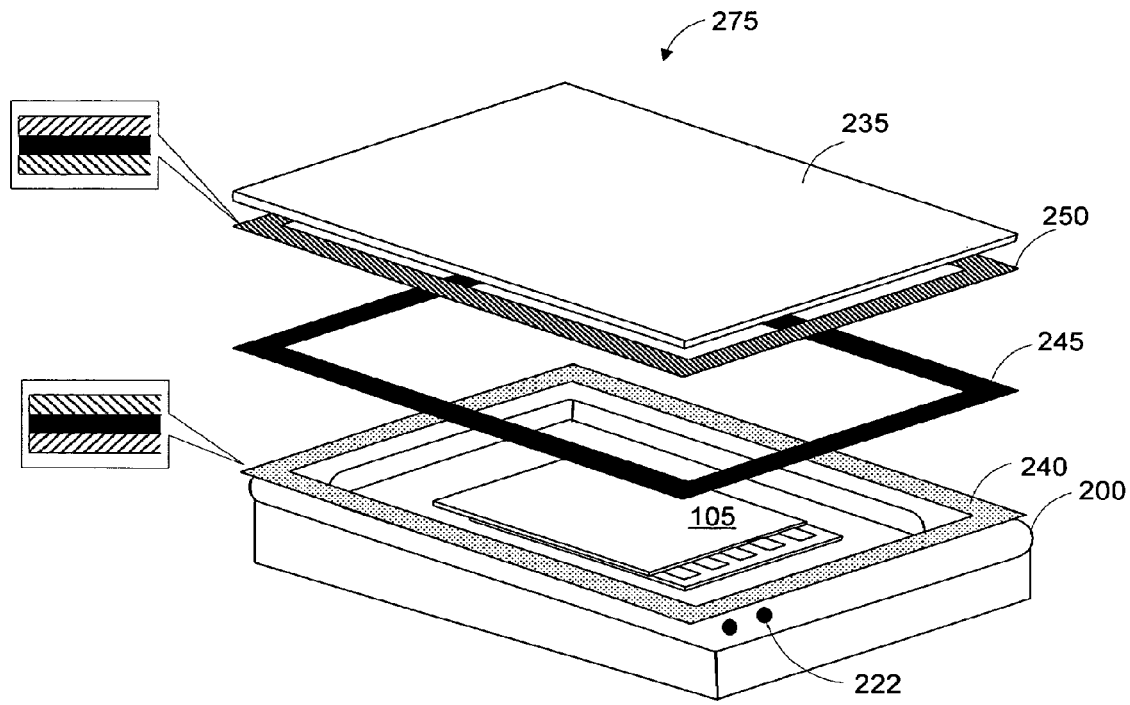
FIG. 5a is a diagram schematically illustrating a micromirror array device that is packaged using a packaging substrate in FIG. 1 according to yet another embodiment of the invention.

Referring to FIG. 5a, sealing medium layer 245 comprises a solderable metallic material that is preferably stable, reliable, cost-effective and has thermal properties (e.g. coefficient of thermal expansion (CET), thermal conductivity, etc.) compatible with the other components, such as package substrate 200 and cover substrate 235, of the micromirror array device package, and more preferably has a low soldering temperature. In order to enhance adhesion of sealing medium layer 245 to the surfaces of substrates 235 and 200, metallization layers 240 and 250 are provided for metalizing the lower surface of cover substrate 235 and top surface of package substrate 200, respectively. Metallization mediums can be any suitable materials, such as aluminum, gold, nickel or composition of two or more of suitable metallic elements, such as gold/nickel, preferably a material with low soldering temperature. These materials can be deposited on the surfaces as thick or thin films using suitable deposition methods, such as those standard methods (e.g. sputtering) for depositing thin film and those standard methods (e.g. print and paste) for depositing thick films. In an embodiment of the invention, metallization medium layer 250 is a thin layer of noble metallic material, such as gold. This metallization medium layer is preferably deposited, such as sputtered as a film on the lower surface of cover substrate 235. Similarly, another metallization layer 240 is provided between sealing medium layer 245 and package substrate 200 for metalizing the top surface of the package substrate. Metallization layer 240 is also preferably deposited, such as sputtered as a film on the upper surface of package substrate 200. When metallization layers 250 and 240 are respectively deposited on the lower surface of cover substrate 235 and the upper surface of substrate 200, these metallization layers may have high soldering temperatures. In this situation, these metallization layers are integral with cover substrate 235 and substrate 200, respectively. Alternatively, metallization layers 250 and 240, each could be a multilayered structure. As an example, the multilayered structure comprises a metal-oxide layer (e.g. $CrO_2$ and $TiO_2$), a metallic layer (e.g. Cr and Ti), a second metallic layer (e.g. Ni) and a third metallic layer (e.g. Au) on top. The metal-oxide layer is first deposited on the surface of the non-metallic substrate, such as ceramic and glass, because it presents strong adhesion to the non-metallic substrate's surface, which is generally oxidized. The metallic layer generally comprises a metallic material that has strong adhesion to the metallic-oxidation layer. The second metallic layer is deposited between the third metallic layer and the first metallic layer to prevent diffusion of the first metallic material into the third metallic layer on top. As another example, metallization layer 240 further comprises a tungsten layer, a nickel layer and a gold layer. Of course, metallization medium layer 250 may also be a multilayered structure that further comprises a plurality of metallization layers as desired. The third metallic layer on top, preferably comprises a metallic material having low oxidation. Exemplary metallic materials for the third metallic layer are Au, Cr and other noble metals.

During the packaging process, the integral heater embedded underneath the surface of package substrate 200 is electrically powered for generating heat so as to solder sealing medium layer 245 between metallization layers 240 and 250. Meanwhile, external pressure may be applied to the package for enforcing bonding package substrate 200 and cover substrate 235, as shown in FIG. 5b.

In another embodiment of the invention, cover substrate 235 may also have a heater. As with the heater (e.g. heater 220) in package substrate 200 described with reference of FIG. 1a, the heater in cover substrate 235 can be formed along the periphery of the surface of the cover substrate and embedded underneath said surface of the cover substrate. This heater in the cover substrate can be used in bonding the cover substrate and the package substrate. And it is especially useful in soldering metallization medium layer 250 and sealing medium layer 245.

Figure 5B:
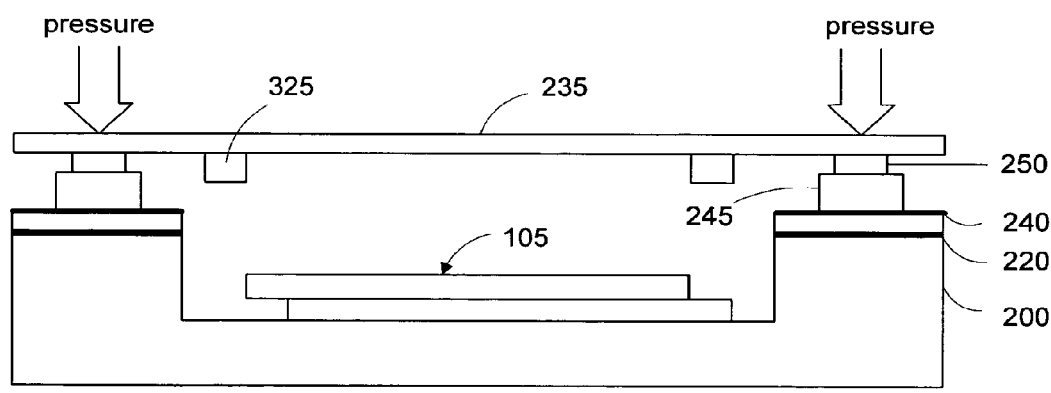

A cross-sectional view of package 275 shown in FIG. 5a is illustrated in FIG. 5b. As seen, other features, such as getters 325, can be provided for absorbing moisture.

Figure 6A:
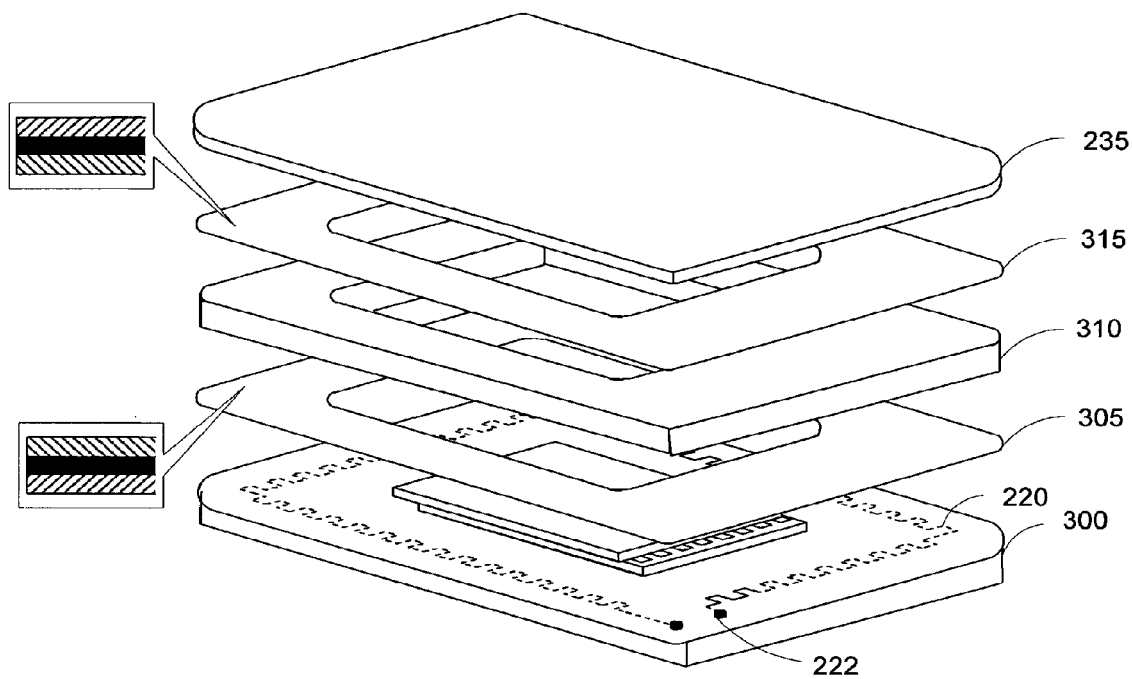
FIG. 6a is a diagram schematically illustrating a micromirror array device that is packaged using a packaging substrate of FIG. 3 according to yet another embodiment of the invention.

A micromirror array device package using the package substrate as shown in FIG. 3 according to a further embodiment of the invention is illustrated in FIG. 6a. As seen, package substrate 300 is a flat plate with integral heater 220 embedded underneath the surface of the package substrate. Micromirror array device 105 is attached to and supported by the package substrate. Spacer 310 is placed on the package substrate and forms a space along with package substrate 300 for accommodating the micromirror array device. Cover substrate 320 is placed above the spacer and the package substrate. In order to bond the package substrate, the spacer and the cover substrate into a micromirror array device package, sealing medium layers 315 and 305 are provided between the cover substrate and the spacer, and between the spacer and the package substrate, respectively. In the embodiment of the invention, package substrate 300 and spacer 310 are ceramic. Alternatively, spacer 310 can be Kovar, Invar, and $NiFe_x$. And cover substrate 320 is light transparent glass. Sealing medium layers 315 and 305 are glass frit. During the packaging process, heater 220 is electrically powered for generating heat so as to melt sealing medium layers 305 and 315. Alternatively, external pressure (not shown) can be applied to enforce the bonding.

As an alternative feature of the embodiment, another heater can be formed in cover substrate 320. The same as the heater in package substrate 300, another heater can be formed along but underneath the surface of the cover substrate. This heater can be electrically powered for generating heat during the packaging process so as to solder sealing medium layer 315. When the sealing medium layer 315 is metallic material, the heater of cover substrate 320 can be formed on the surface of the cover substrate for producing heat so as to solder sealing medium 315.

In another embodiment of the invention, the cover substrate, the spacer and the package substrate can be bonded using solderable metallic sealing mediums. In this situation, sealing medium layers 315 and 305 each can be a combination of two metallization layers (e.g. metallization layers 250 and 240 in FIG. 5a) and a sealing medium layer (e.g. sealing medium layer 245 in FIG. 5a) disposed between the two metallization layers. Alternatively, each of the metallization layers of the combination can be a multilayered structure that further comprises a plurality of metallization layers. As an example, each sealing medium layer 315 or 305 can be a combination of a Au (or Al) layer and a Kovar (or Invar) layer and a Au (or Al) layer, or a combination of a Au (or Al) layer and a Kovar (or Invar) layer and a multilayered structure that further comprises a Au layer and a Nickel layer and a tungsten layer.

As discussed above, cover substrate 320 is glass for allowing incident light traveling through to shine on the micromirror array device. Alternatively, the cover substrate can be a ceramic or metallic material or any other desired materials that are not transparent to visible light. In this case, the cover substrate comprises a window with inlay glass for allowing incident light passing through. Alternatively, a glass plate may be mounted on the window of the substrate that is not incident light transparent. As a further alternative feature of the embodiment, a light blocking mask (e.g. a rectangular frame) that blocks incident light around the periphery of the micromirror array device is attached to the surface of the cover substrate, or directly painted or otherwise deposited around the circumference of the cover substrate. This is particularly useful when the cover substrate is glass.

Other than the flat shape, the cover substrate can be a concave cover cap (not shown) with the lower surface of the cover substrate extended towards the opposite surface (e.g. the top surface) of the cover substrate. In this case, the cover cap and package substrate 300 can form a space for housing the micromirror array device without spacer 310. Accordingly, the number of metallization medium layers and the number of sealing medium layers can be reduced, and bonding process can be simplified. For example, when cover substrate 320 that is a cover cap and package substrate 300 is provided for housing micromirror array device 105, packaging processes described with reference to FIGS. 4a and 5a can be directly applied herein.

Figure 6B:
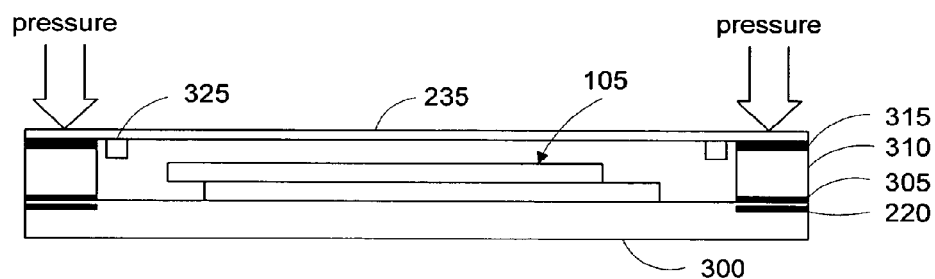

Referring to FIG. 6b, a cross-sectional view of the micromirror array package in FIG. 6a is illustrated therein. In addition to the packaging substrate, the cover substrate, the sealing medium layer and the metallization medium layers, getters may also be formed within the package. The cover light transmissive substrate need not be parallel to the lower substrate and the micromirror array device, such as set forth in U.S. patent application Ser. No. 10/343,307, filed on Jan. 29, 2003 to Huibers, the subject matter of which being incorporated herein by reference.

Figure 7:
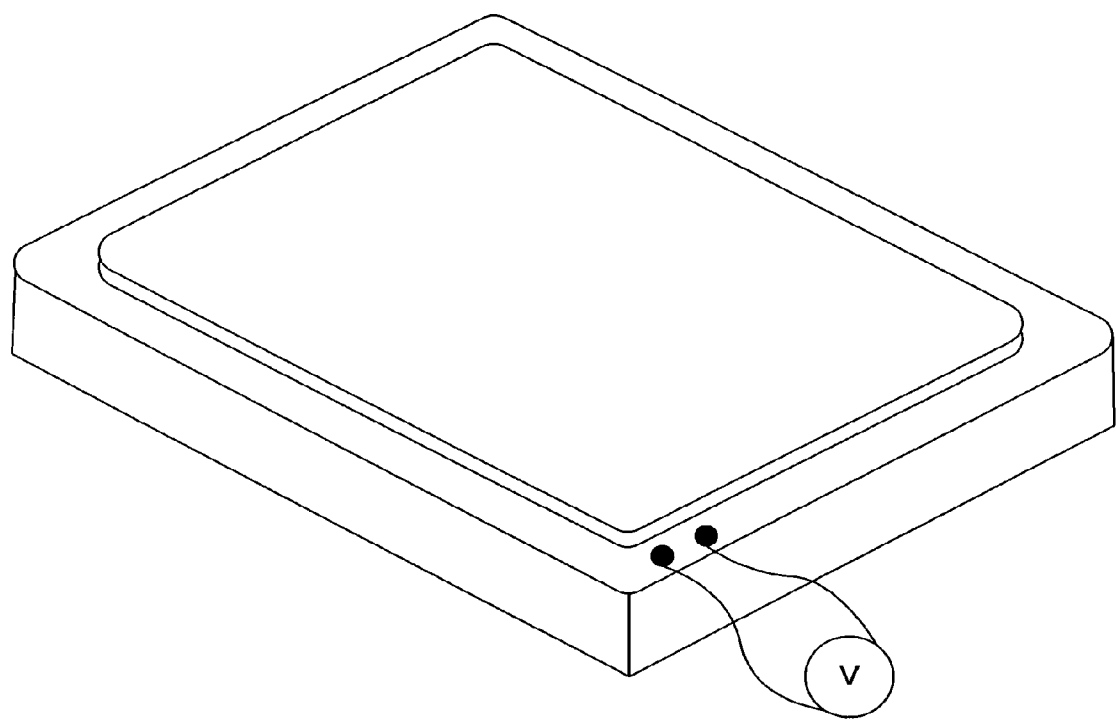
FIG. 7 is a diagram schematically illustrating a packaged micromirror array device.

The micromirror array package of the present invention has a variety of applications (e.g. maskless lithography, atomic spectroscopy, maskless fabrication of micromirror arrays, signal processing, microscopy, image sensors/detectors and CCDs, etc.), one of which is in display systems. FIG. 7 illustrates an exemplary micromirror array package according to an embodiment of the invention. The micromirror array device is bonded within the package for protection. Incident light can travel through the cover substrate and shine on the micromirrors of the micromirror array device. This package can then be employed in practical applications, one of which is display systems.

Figure 8A:
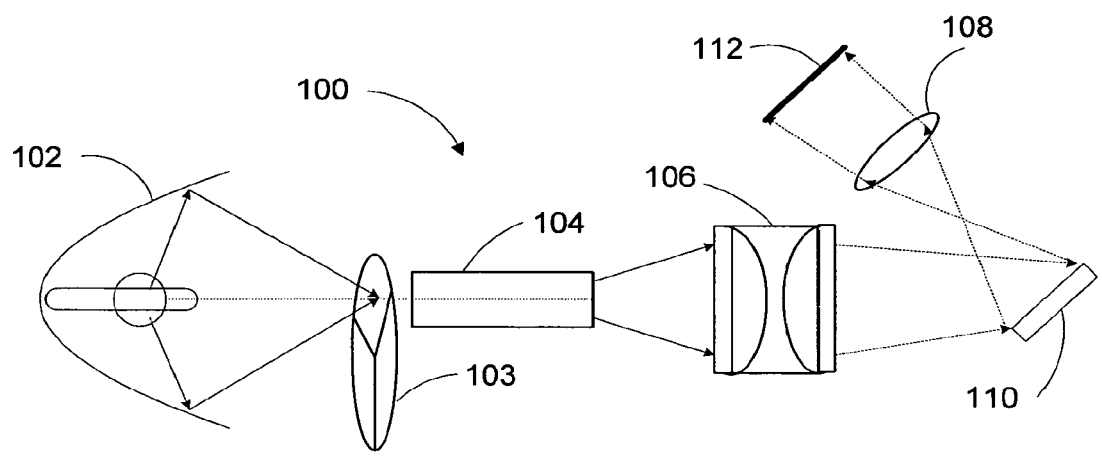
FIG. 8a is a simplified display system employing the packaged micromirror array device of FIG. 7.

Referring to FIG. 8a, a typical display system employing a micromirror array device package of FIG. 7 is illustrated therein. In its very basic configuration, the display system comprises light source 102, optical devices (e.g. light pipe 104, lens 106 and 108), color wheel 103, display target 112 and spatial light modulator 110 that uses micromirror array device package of FIG. 7. Light source 102 (e.g. an arc lamp) directs incident light through the color wheel and optical devices (e.g. light pipe 104 and object lens 106) and shines on spatial light modulator 110. Spatial light modulator 110 selectively reflects the incident light toward optical device 108 and results in an image on display target 112. The display system can be operated in many ways, such as those set forth in U.S. Pat. No. 6,388,661, and U.S. patent application Ser. No. 10/340,162, filed on Jan. 10, 2003, both to Richards, the subject matter of each being incorporated herein by reference.

Figure 8B:
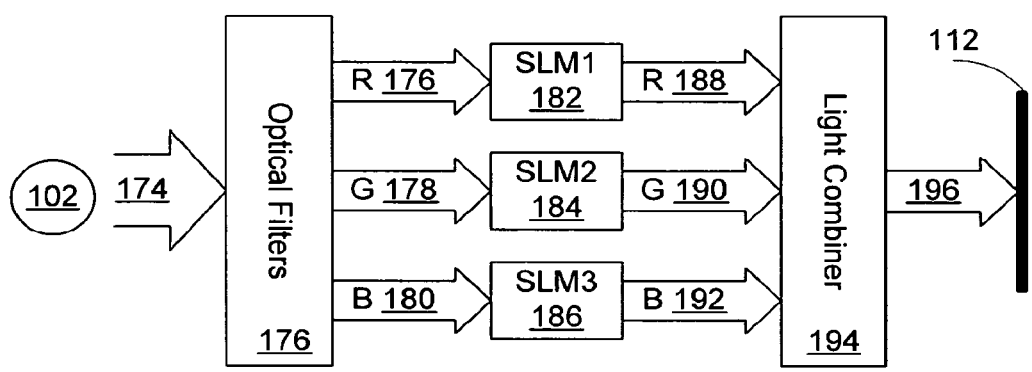
FIG. 8b is a block diagram illustrating an exemplary operation of a display system employing three packaged micromirror array devices of FIG. 7.

Referring to FIG. 8b, a block diagram illustrating a display system employing three spatial light modulators, each having a micromirror array device package of FIG. 7, is shown, wherein each spatial light modulator is designated for respectively modulating the three primary color (i.e. red, green and blue) light beams. As shown, light 174 from light source 102 passes through optical filters 176 and is split into three primary color light beams, that is, red light 176, green light 178 and blue light 180. Each color light beam impinges a separate spatial light modulator and is modulated thereby. Specifically, red light 176, green light 178 and blue light 180 respectively impinge on spatial light modulators 182, 184 and 186 and are modulated. The modulated red light 188, green light 190 and blue light 192 are recombined at light combiner 194 for forming modulated color images. Combined color light 196 is directed (e.g. by projection lens) onto display target 112 for viewing. A simplified display system based on the block diagram of FIG. 8b is presented in FIG. 8c.

Figure 8C:
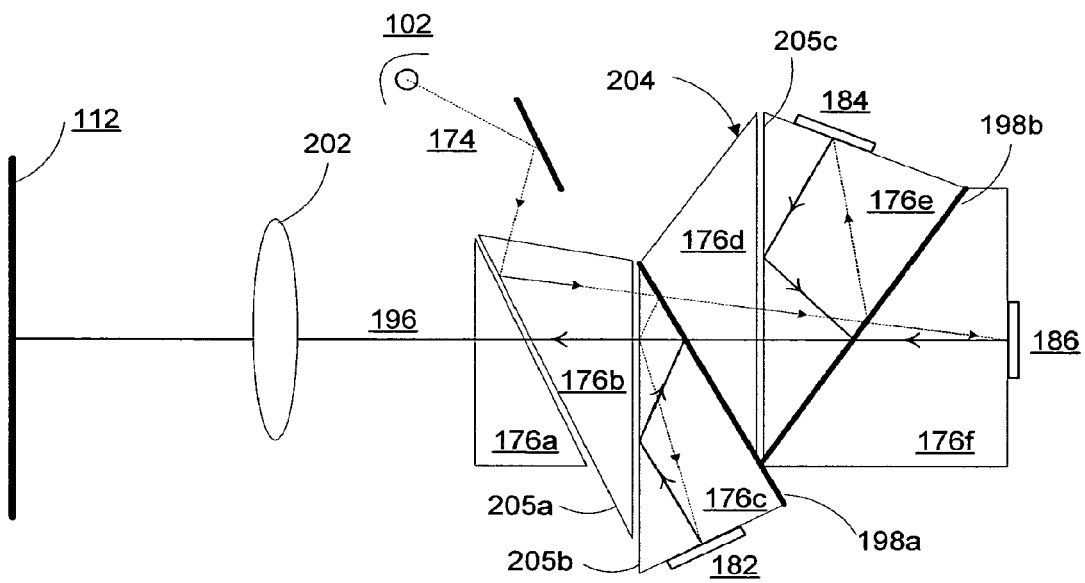
FIG. 8c is a diagram schematically illustrating a display system employing three packaged micromirror array devices of FIG. 7.

Referring to FIG. 8c, the display system employs a dichroic prism assembly 204 for splitting incident light into three primary color light beams. Dichroic prism assembly 204 comprises prisms 176a, 176b, 176c, 176d, 176e and 176f. Totally-internally-reflection (TIR) surfaces, i.e. TIR surfaces 205a, 105b and 205c, are defined at the prism surfaces that face air gaps. The surfaces 198a and 198b of prisms 176c and 176e are coated with dichroic films, yielding dichroic surfaces. In particular, dichroic surface 198a reflects green light and transmits other light. Dichroic surface 198b reflects red light and transmits other light. The three spatial light modulators, 182, 184 and 186 are arranged around the prism assembly. Each spatial light modulator comprises a micromirror array device package of FIG. 7 for modulating incident light.

Regardless of whether the optical system utilizes a single micromirror array package as in FIG. 8a, or multiple micromirror array packages as in FIGS. 8b and 8c, reflection from light transmissive substrates is preferably minimized. In operation, incident white light 174 from light source 102 enters into prism 176b and is directed towards TIR surface 205a at an angle larger than the critical TIR angle of TIR surface 205a. TIR surface 205a totally internally reflects the incident white light towards spatial light modulator 186, which is designated for modulating the blue light component of the incident white light. At the dichroic surface 198a, the green light component of the totally internally reflected light from TIR surface 205a is separated therefrom and reflected towards spatial light modulator 182, which is designated for modulating green light. As seen, the separated green light may experience TIR by TIR surface 205b in order to illuminate spatial light modulator 182 at a desired angle. This can be accomplished by arranging the incident angle of the separated green light onto TIR surface 205b larger than the critical TIR angle of TIR surface 205b. The rest of the light components, other than the green light, of the reflected light from the TIR surface 205a pass through dichroic surface 198a and are reflected at dichroic surface 198b. Because dichroic surface 198b is designated for reflecting red light component, the red light component of the incident light onto dichroic surface 198b is thus separated and reflected onto spatial light modulator 184, which is designated for modulating red light. Finally, the blue component of the white incident light (white light 174) reaches spatial light modulator 186 and is modulated thereby. By collaborating operations of the three spatial light modulators, red, green and blue lights can be properly modulated. The modulated red, green and blue lights are recollected and delivered onto display target 112 through optic elements, such as projection lens 202, if necessary.

Figure 9A:
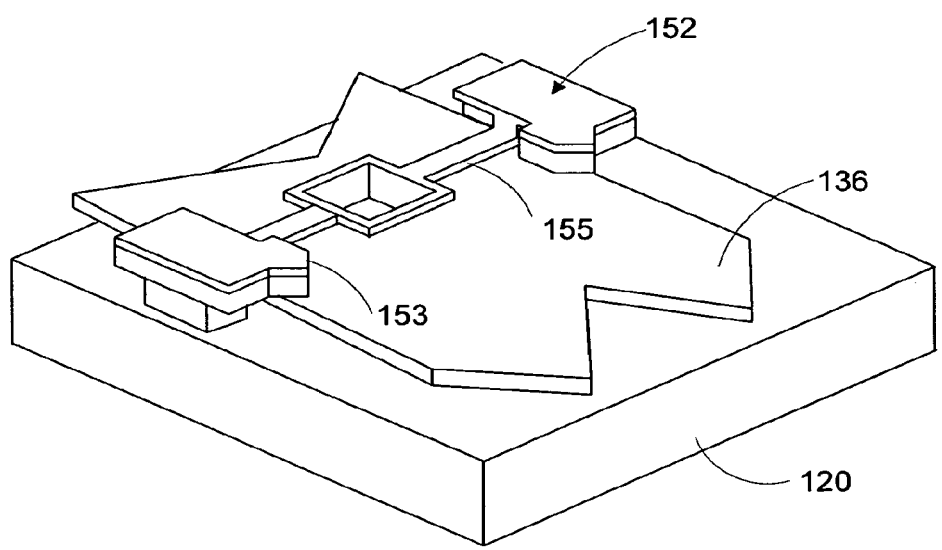
FIG. 9a is a diagram schematically illustrating an exemplary micromirror of the micromirror array.
Figure 9B:
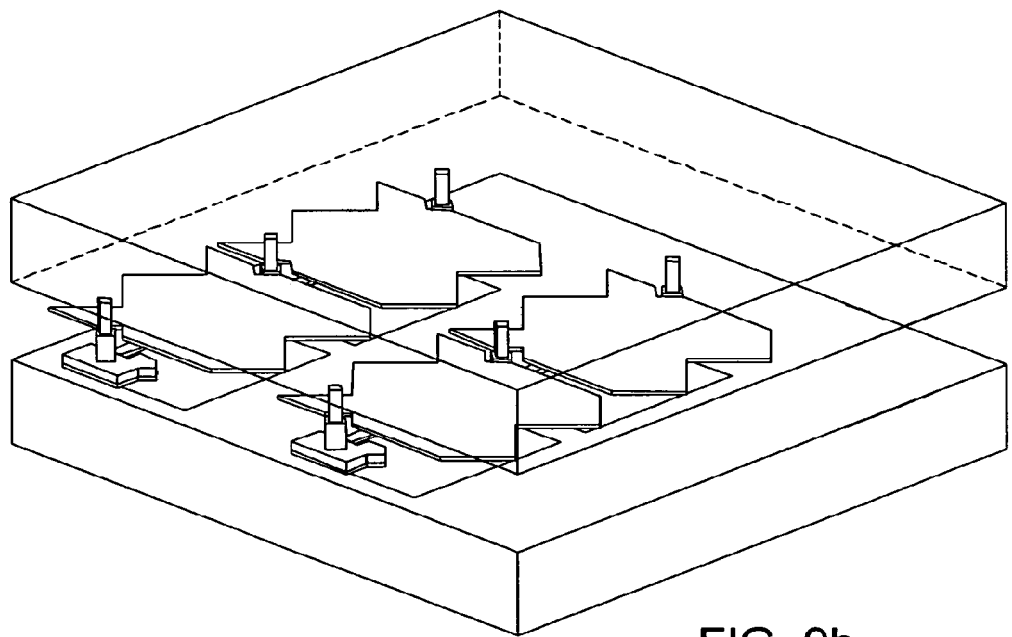

Referring to FIG. 9a, an exemplary micromirror device of the micromirror array device is illustrated therein. As seen, micromirror plate 136 is attached to hinge 155. The hinge is held by posts 152 that are formed on substrate 120. With this configuration, the micromirror plate can rotate above the substrate along the hinge. As an alternative feature, two stoppers are formed for controlling the rotation of the micromirror plate. The substrate is preferably glass. Alternatively, the substrate can be a semiconductor wafer, on which standard DRAM circuitry and electrodes can be constructed. FIG. 9b illustrates a micromirror array comprising a plurality of micromirror devices in FIG. 9a. The array is formed on the upper substrate which is preferably light transparent glass. The lower substrate, which is preferably a semiconductor wafer, has formed thereon an array of electrodes and circuitry for electrostatically controlling the rotation of the micromirrors in the upper substrate. Other than forming the micromirror array and the electrode and circuitry array on different substrates as discussed above, they can be fabricated on the same substrate.

Figure 10A:
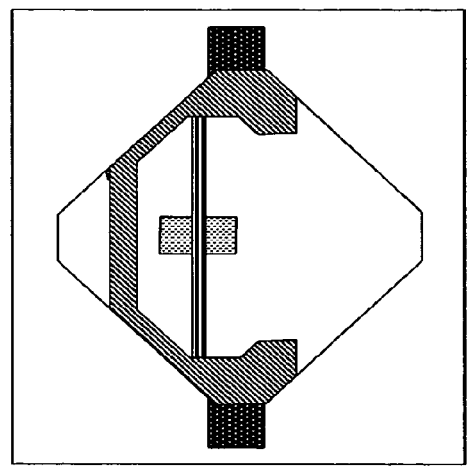
FIG. 10a is a diagram schematically illustrating another exemplary micromirror of the micromirror array.
Figure 10B:
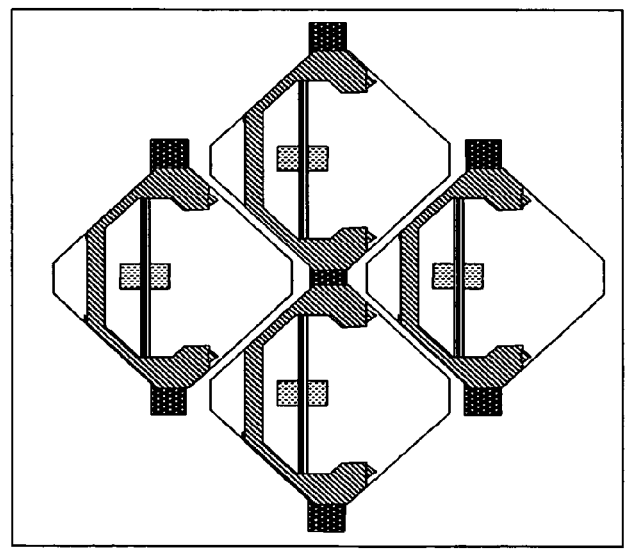

FIGS. 9a and 9b illustrate an exemplary micromirror device having a micromirror plate with zigzag edges. This is not an absolute requirement. Instead, the micromirror plate can be of any desired shape. Another exemplary micromirror device with a different configuration is illustrated in FIG. 10a. Referring to FIG. 10a, the micromirror plate has a "diamond" shape. The hinge is arranged parallel to but off-set from a diagonal of the micromirror plate. It is worthwhile to point out that the hinge structure has an arm that is extended towards one end of the micromirror plate. The entire hinge structure and the hinge are formed underneath the micromirror plate. This configuration has many benefits, such as reducing the refraction of the incident light by the hinge and the hinge structure. FIG. 10b illustrates an exemplary micromirror array device composed of a plurality of micromirror devices of FIG. 10a.

As discussed above, sealing medium layers, such as layer 230 in FIG. 4a and layer 245 in FIG. 5a, are preferably layers that comprise materials with low melting or soldering temperatures. In fact, other suitable materials with relatively high melting or soldering temperatures may also be used. In this situation, external cooling mechanisms, such as cooling plates can be employed for dissipating heat from the package. For example, a cooling plate can be attached to substrate 200 in FIG. 4a and FIG. 4b. Moreover, the present invention is not only useful in low temperature packaging applications, but also in high temperature packaging applications.

It will be appreciated by those skilled in the art that a new and useful micromirror array package and methods of applying the same for packaging micromirror array devices have been described herein. In view of the many possible embodiments to which the principles of this invention may be applied, however, it should be recognized that the embodiments described herein with respect to the drawing figures are meant to be illustrative only and should not be taken as limiting the scope of invention. For example, those of skill in the art will recognize that the illustrated embodiments can be modified in arrangement and detail without departing from the spirit of the invention. In particular, other protective materials, such as inert gas, may be filled in the space formed by the package substrate and the cover substrate. For another example, the package substrate, as well as the cover substrate and the spacer, can be other suitable materials, such as silicon dioxide, silicon carbide, silicon nitride, and glass ceramic. For yet another example, other suitable auxiliary methods and components, such as applications of Infrared Radiation during bonding for soldering the sealing medium layers, and pillars or other structures for aligning the substrates are also applicable. Moreover, other desired materials, such as antistiction material, preferably in vapor phase for reducing stiction of the micromirrors of the micromirror array device, may also be deposited inside the package. The anti-stiction material can be deposited before bonding the cover substrate and lower substrate. When the cover substrate (e.g. cover substrate 235 in FIGS. 4a, 4b and 4c) is glass that is visible light transmissive, it can be placed parallel to the micromirror array device (e.g. device 105 in FIGS. 4a, 4b and 4c) and the package substrate (e.g. package substrate 300). Alternatively, the cover substrate may be placed at an angle with the micromirror array device or the package substrate. Therefore, the invention as described herein contemplates all such embodiments as may come within the scope of the following claims and equivalents thereof.

I claim:

1. A method comprising:
providing a packaging substrate having a first ceramic or glass substrate layer with a concave upper surface that forms a cavity, a second ceramic or glass substrate layer with a lower surface joined to the first layer upper surface peripherally surrounding the cavity and with an upper surface, and a heater comprising a metallic film formed integrally with the packaging substrate between the joined lower first and upper second substrate layer surfaces, wherein the heater is located at a distance of 1-10 mm below the upper surface of the second substrate layer;
providing a cover substrate comprising transparent material at least in a portion configured to overlie the cavity when the cover substrate is joined to the packaging substrate;
depositing a first metallic film layer peripherally on a lower surface of the cover substrate;
depositing a second metallic film layer peripherally of the cavity on the upper surface of the packaging substrate;
attaching a microelectromechanical system (MEMS) device within the cavity; and
bonding the cover substrate peripherally to the packaging substrate so as to enclose the device within the cavity between the bonded cover and packaging substrates;
wherein the bonding comprises disposing a metallic soldering material between the first and second metallic film layers, the metallic soldering material having a soldering temperature less than a melting temperature of the metallic film layers; and applying heat locally by driving an electric current through the heater to melt the soldering material without melting the metallic film layers and without raising a temperature of the device to the soldering temperature, wherein the soldering temperature is less than 300° C. and wherein the heat is applied without raising the temperature of the device to a temperature of 70° C.

2. The method of claim 1, further comprising applying external pressure to the cover substrate during the bonding.

3. The method of claim 1, wherein the heater is located at a distance of about 7 mm below the upper surface of the second substrate layer.

4. The method of claim 1, wherein the electric current is driven through the heater by applying a voltage of 40-100 volts to the heater.

5. The method of claim 4, wherein the electric current is driven through the heater by applying a voltage of about 70 volts to the heater.

6. The method of claim 4, wherein the heater is formed in a zigzag configuration.

7. The method of claim 6, wherein the zigzag configuration terminated in two leads, and the voltage is applied across the two leads.

8. The method of claim 7, wherein the first and second metallic films comprise at least one of aluminum, gold or nickel.

9. The method of claim 8, wherein the first and second metallic films are deposited by sputtering.

10. The method of claim 7, wherein the first and second metallic films comprise a metal oxide layer, at least one intermediate metallic layer formed over the metal oxide layer, and a top metallic layer.

11. The method of claim 10, wherein the top metallic layer comprises Tu, Ni or Au.

12. The method of claim 10, wherein the top metallic layer comprises Au, Cr or other noble metal.

13. The method of claim 10, wherein the metal oxide layer comprises $CrO_2$ or $TiO_2$, the at least one intermediate metallic layer includes a first intermediate layer comprising Cr or Ti and a second intermediate layer comprising Ni, and the top metallic layer comprises Au.

14. The method of claim 1, wherein the heater is formed in a zigzag configuration.

15. The method of claim 14, wherein the zigzag configuration terminated in two leads, and the voltage is applied across the two leads.

16. The method of claim 1, wherein the first and second metallic films comprise at least one of aluminum, gold or nickel.

17. The method of claim 1, wherein the first and second metallic films are deposited by sputtering.

18. A method comprising:
providing a packaging substrate having a first ceramic or glass substrate layer with a concave upper surface that forms a cavity, a second ceramic or glass substrate layer with a lower surface joined to the first layer upper surface peripherally surrounding the cavity and with an upper surface, and a heater comprising a metallic film formed integrally with the packaging substrate between the joined lower first and upper second substrate layer surfaces;
providing a cover substrate comprising transparent material at least in a portion configured to overlie the cavity when the cover substrate is joined to the packaging substrate;
depositing a first metallic film layer peripherally on a lower surface of the cover substrate;
depositing a second metallic film layer peripherally of the cavity on the upper surface of the packaging substrate;
attaching a microelectromechanical system (MEMS) device within the cavity; and
bonding the cover substrate peripherally to the packaging substrate so as to enclose the device within the cavity between the bonded cover and packaging substrates;
wherein the bonding comprises disposing a metallic soldering material between the first and second metallic film layers, the metallic soldering material having a soldering temperature less than a melting temperature of the metallic film layers; and applying heat locally by driving an electric current through the heater to melt the soldering material without melting the metallic film layers and without raising a temperature of the device to the soldering temperature, wherein the first and second metallic films comprise a metal oxide layer, at least one intermediate metallic layer formed over the metal oxide layer, and a top metallic layer.

19. The method of claim 18, wherein the top metallic layer comprises Ti, Ni or Au.

20. The method of claim 18, wherein the top metallic layer comprises Au, Cr or other noble metal.

21. The method of claim 18, wherein the metal oxide layer comprises $CrO_2$ or $TiO_2$, the at least one intermediate metallic layer includes a first intermediate layer comprising Cr or Ti and a second intermediate layer comprising Ni, and the top metallic layer comprises Au.

22. The method of claim 1, wherein the cover substrate comprises glass or quartz, and the device is a digital micromirror device (DMD).

* * * * *